United States Patent [19]

Ishii et al.

[11] Patent Number: 4,805,113
[45] Date of Patent: Feb. 14, 1989

[54] METHOD OF UPDATING LAYOUT OF CIRCUIT ELEMENT

[75] Inventors: Tatsuki Ishii, Tokyo; Makiko Iwanabe, Shimizu, both of Japan

[73] Assignee: Hitachi, Ltd., Tokyo, Japan

[21] Appl. No.: 849,831

[22] Filed: Apr. 9, 1986

[30] Foreign Application Priority Data

Apr. 10, 1985 [JP] Japan ................................. 60-74219

[51] Int. Cl.$^4$ ........................ G06F 15/46; G06F 15/62
[52] U.S. Cl. ..................................... 364/491; 364/490; 364/489; 364/488
[58] Field of Search ............... 364/488, 489, 490, 491, 364/300, 521

[56] References Cited

U.S. PATENT DOCUMENTS

| | | | |
|---|---|---|---|
| 3,617,714 | 11/1971 | Kernighan et al. | 364/300 |
| 4,577,276 | 3/1986 | Dunlop et al. | 364/491 |
| 4,630,219 | 12/1986 | DiGiacoma et al. | 364/491 |
| 4,636,965 | 1/1987 | Smith et al. | 364/491 |
| 4,636,966 | 1/1987 | Yamada et al. | 364/491 |

*Primary Examiner*—Parshotam S. Lall
*Assistant Examiner*—V. N. Trans
*Attorney, Agent, or Firm*—Antonelli, Terry & Wands

[57] ABSTRACT

For the purpose of satisfying placement constraint prescribed by design rule data, a region to which a plurality of circuit elements appertain is displayed in such a way that this region is moved to such a position as to environ a part of the circuit elements and at the same time is superposed on a layout graph thereof. The placement of the circuit elements is updated such that some elements placed outside the foregoing region among all the circuit elements are made to enter this region.

12 Claims, 6 Drawing Sheets

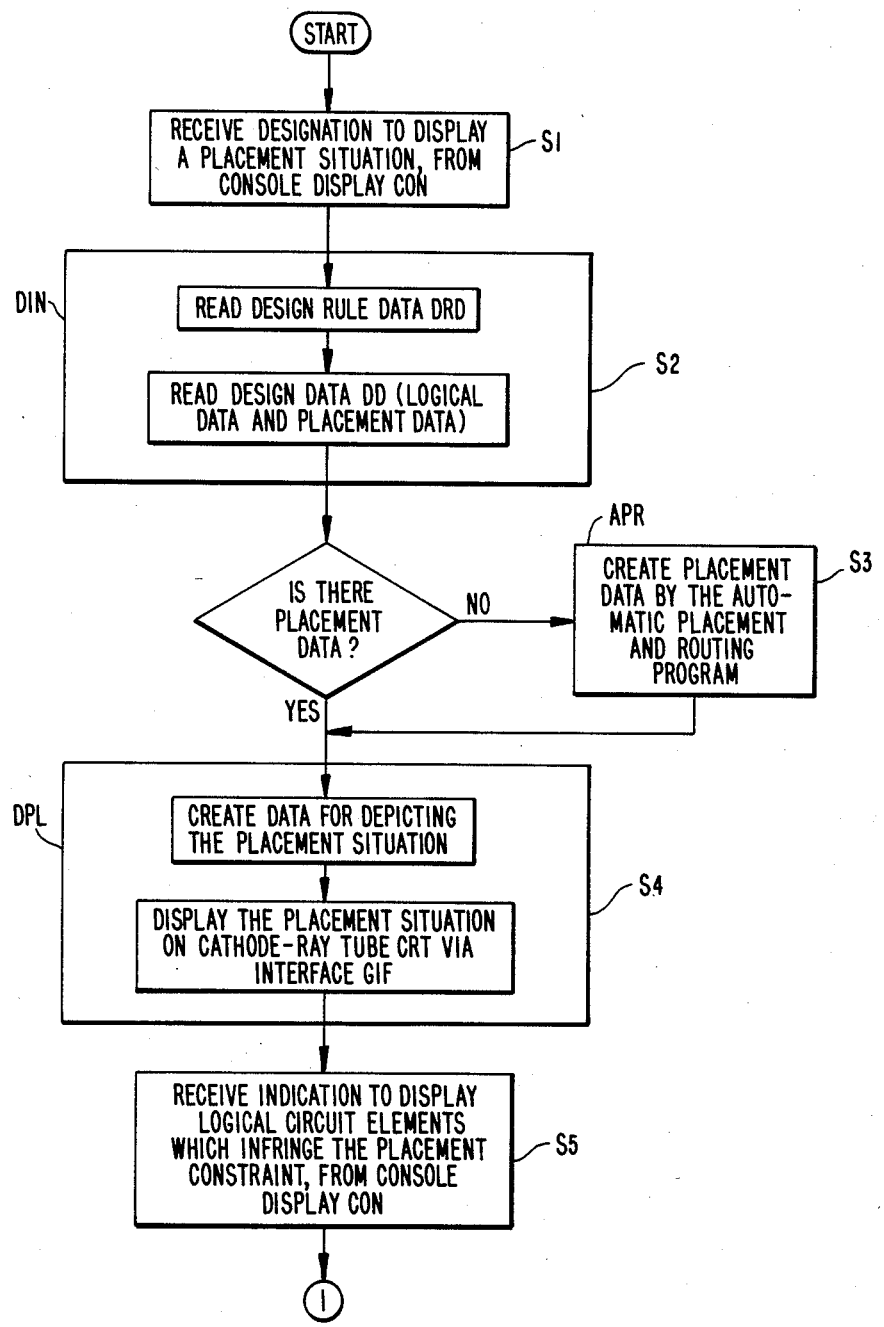

METHOD OF UPDATING LAYOUT OF CIRCUIT ELEMENT

BACKGROUND OF THE INVENTION

The present invention relates to a method of updating a layout of circuit elements on a semiconductor integrated circuit or on a printed circuit board (hereinafter referred to as a substrate), and more particularly, to a layout updating method suitable for modifying the layout of the circuit elements on the semiconductor integrated circuit by an interactive operation.

In a layout method concerning layout and wiring methods for instance, see p1164~p1171 of a treatise issued in 1983, Vol. J66-C, No. 12, published by Institute of Electronics and Communication Engineers of Japan), wherein logical circuit elements are disposed on a substrate and signal wires between terminals of the elements are connected in accordance with an orthogonal wiring method in which a first wiring operation is carried out in the lateral direction and a second wiring operation is executed in the perpendicular direction, it is in general required that the wiring length not exceed a specified value, depending on the driving capability of the logical circuit elements. Namely, if an aggregate of the logical circuit elements linked to a single signal line is disposed in an extraordinarily broad range, the situation will transcend the limits of placement constraint.

According to a layout updating method for especially renewing the placement of the logical circuit elements disposed on the substrate, it is feasible to display configurations of the logical circuit elements, arrangement positions thereof and empty areas as well where no element is disposed. It is therefore practicable that the logical circuit elements are replaced or shifted, and an aggregate of the elements linked to a given signal line is classified by color and connected by line segments in order to be displayed.

While on the other hand, a layout updating method that has heretofore been adopted creates such defects that if the aggregate of the logical circuit elements linked to a predetermined signal line is modified in terms of layout, while maintaining the placement constraint, it is inexplicit to select the elements which are to be shifted or replaced, and to specify the destinations to which the elements are moved, this tending to require a longer time than expected in settling the final placement which meets the placement constraint thereof on account of the user's tendency to rely on trial and error evaluation which is based on his intuition.

SUMMARY OF THE INVENTION

Accordingly, it is a primary object of the present invention to provide a layout updating method which lessens the labor of determining the objective elements to be selected and setting the destinations to which the elements are shifted when modifying the disposed positions of the logical circuit elements with a view to maintaining the placement constraint.

Between terminals of the logical circuit elements there is carried out a wiring operation in two directions which are orthogonal to each other, viz., a direction x (lateral) and a direction y (vertical), in which case wiring layers are classified according to the directions x, y. In adopting such a wiring mode, the distance between two points involves an orthogonal distance which is given by:

$$d(p_1, p_2) = |x_1 - x_2| + |y_1 + y_2|$$

where $X_1$, $Y_2$ are the coordinates of pi. As shown in FIG. 1, a region in which the orthogonal distance is not more than 1 assumes a rhombus whose diagonal length is 1. That is, a distance between two points in this rhombus is less than 1. Hence, in order for the wiring length to be equal to the reference value 1 or less, there is formed a rhombus the diagonal length of which is 1, and terminals to be connected, viz., logical circuit elements, are disposed within a scope confined by the rhombus, thereby increasing the possibility of distributing a wire within the wiring length 1 unless the wiring unusually makes a detour.

Generally speaking, the placement constraint is simply contingent upon the wiring length, or rather wiring capacitance. The wiring capacitance per unit length differs according to the wiring layer and hence the capacitance varies even if the wiring length is the same with respect to the directions x, y. With the intention of preventing the wiring capacitance from exceeding a reference value C, as shown in FIG. 2, a rhombus is sought, the diagonal lengths of which are lx and ly that are obtained by converting the reference value C into a length on the basis of the wiring capacitance per unit length with respect to the materials wired in both the directions x, y; and the elements may be disposed in a region established by the thus formed rhombus.

As described above, the placement constraint can be estimated in the range set by the rhombus. If the elements disposed outside the rhombus are arranged to move into this rhombic region by a display step wherein the rhombus is superposed on the logical circuit elements, it is relatively easy to abide by the placement constraint.

The present invention yields such favorable effects that inasmuch as an objective scope can be confined to a visible form like a rhombus if modifying the layout in order not to transgress the placement constraint, it is possible to readily select the logical circuit elements whose layout is to be modified, determine the destinations associated with the modification, and eliminate such trial and error determinations as remodification because of the fact that the modification infringes the placement constraint, thereby enhancing design efficiency.

BRIEF DESCRIPTION OF THE DRAWINGS

In the accompanying drawings:

FIGS. 7A, 7B and 7C are flowcharts which illustrate the steps of operation of the method of the present invention.

DETAILED DESCRIPTION OF THE PREFERRED EMBODIMENTS

One embodiment according to the present invention will hereinafter be described with reference to the accompanying drawings.

Figure 1:
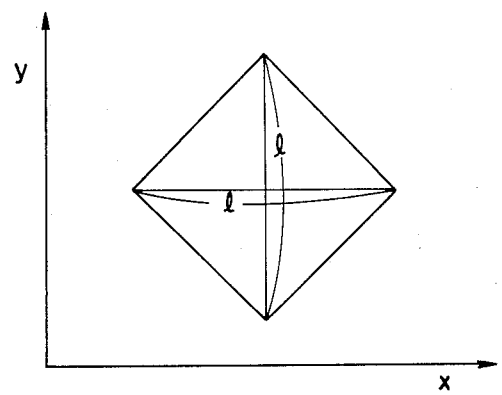
FIG. 1 is a conceptual view showing a region set by a rhombus where the diagonal lengths are all 1 and the wiring length is less than 1.
Figure 2:
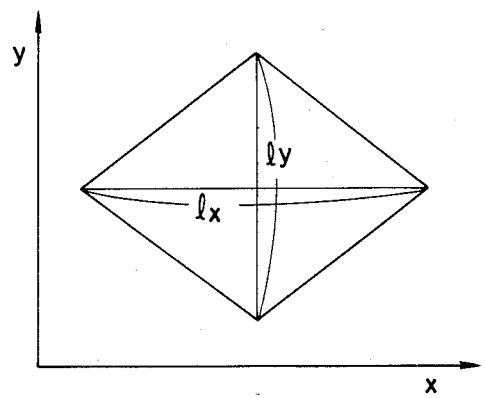
FIG. 2 is a conceptual view showing placement constraint in a rhombus where lx and ly are the diagonal lengths thereof.
Figure 3:
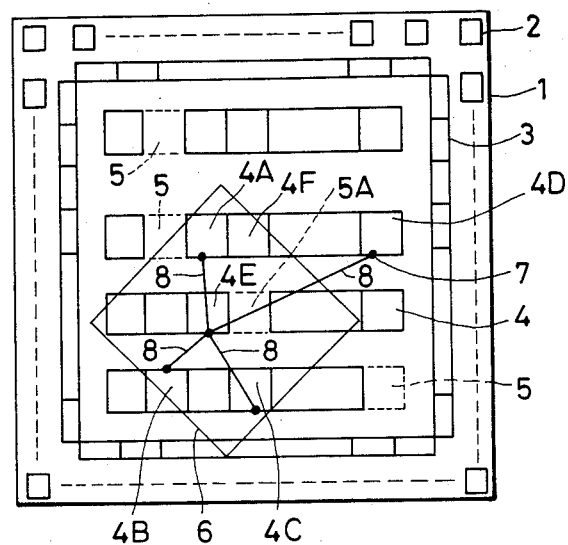
FIGS. 3 to 5 inclusive are views showing situations in which rhombuses according to the present invention are superposed on the disposed elements.
Figure 4:
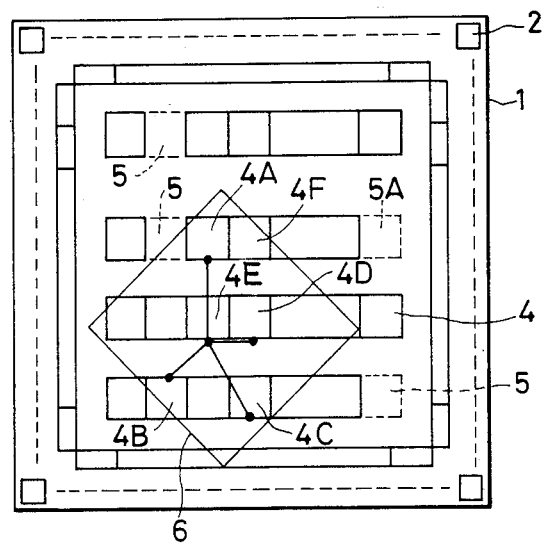

In FIG. 3, there is shown a situation where logical circuit elements are disposed on a substrate of a semiconductor integrated circuit 1. In the Figure, the reference numeral 2 stands for a bonding pad, the numeral 3 represents a logical circuit element which is disposed on the fringe of the substrate, the numeral 4 denotes a logical circuit element disposed on the inner surface thereof, 5 denotes an empty area and 7 denotes a terminal. Line segments 8 respectively indicate that each of the logical circuit elements 4A to 4E inclusive is contingent on a certain signal line. It can be observed through the Figure that the element 4D is disposed at a more remote position than other elements. Namely, in a rhombus 6 whose size is set by a placement constraint with respect to this signal line, it is impossible to encompass all these five elements 4A, 4B, 4C, 4D, 4E. The rhombus 6 is placed so as to surround the elements 4A, 4B, 4C, 4E. On the basis of the display shown in FIG. 3, FIG. 4 shows a situation wherein the element 4D disposed outside the rhombus 6 is replaced with the empty area 5A inside the rhombus 6. It can be understood from the Figure that all the given elements which belong to this signal line are disposed within the rhombus 6, this satisfying the placement constraint.

Figure 5:
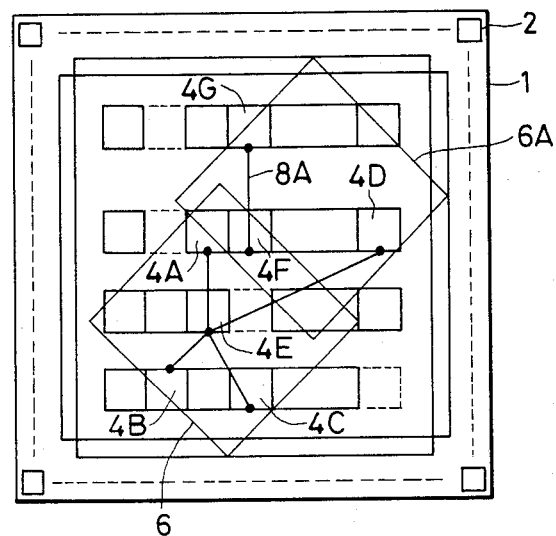

FIG. 5 is a view showing a state where the element 4D disposed outside the rhombus 6 is replaced with some of the elements disposed within the rhombus 6. If the objectives are replaced be defined as the empty areas, there is not the least probability for the objective elements to infringe on the placement constraint on the occasion of replacement. However, given that the objective elements relate to another signal line, there may exist both cases of replacement and infringement and hence it is required to examine whether or not it breaks the constraint before the replacement is carried out. In time of considering the replacement with the element 4F which belongs to another signal line arranged in the rhombus 6, the element 4F is, as indicated by a line segment 8A, associated with the element 4G; and if this replacement is adapted to the placement constraint, it is feasible to encompass the elements 4F and 4G by use of a rhombus which is determined in size according to the placement constraint. In FIG. 5, there is illustrated a rhombus 6A which moves to such a position as to surround the noticeable element 4D while also encompassing the elements 4F, 4G. When replacing the element 4D with the element 4F in accordance with the display shown in FIG. 5, the placement constraint of the respective elements can be kept.

Figure 6:
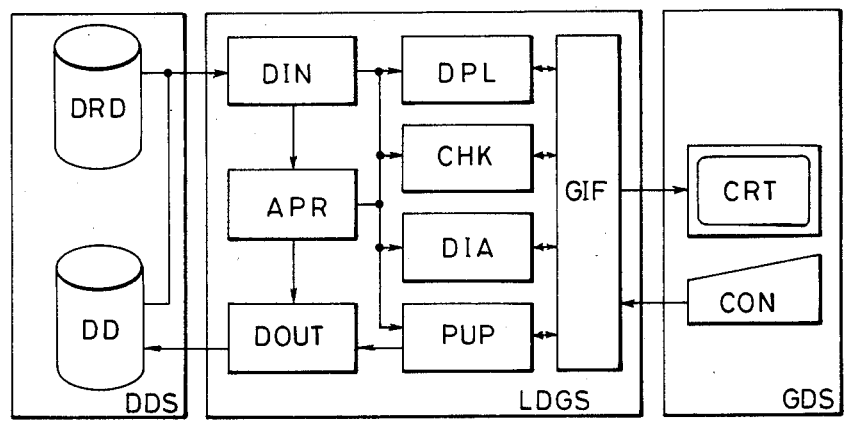
FIG. 6 is a schematic diagram showing an embodiment which illustrates a layout updating method of the present invention.

FIG. 6 is a schematic diagram for explaining the displaying of a rhombus according to the present invention. In the Figure, DDS represents a design database system such as a conventional disc storage unit, LDGS denotes a layout design graphic system which may be provided as a computer system and GDS is a conventional graphic display terminal. DRD in the design database system DDS represents stored design rule data inclusive of the placement constraint; and DD represents stored design data including logical data and placement data. In the layout design graphic system LDGS, DIN is a program module for a data input, DOUT is a program module for data output, APR is a conventional automatic placement and routing program module, DPL is a placement display program module, a CHK is a placement constraint check program DIA is diamond display program PUP is a placement update program module and GIF is conventional interface to graphic display program module. In the graphic display system GDS, a CRT represents a cathode-ray tube unit and a CON is a console display unit.

Figure 7B:
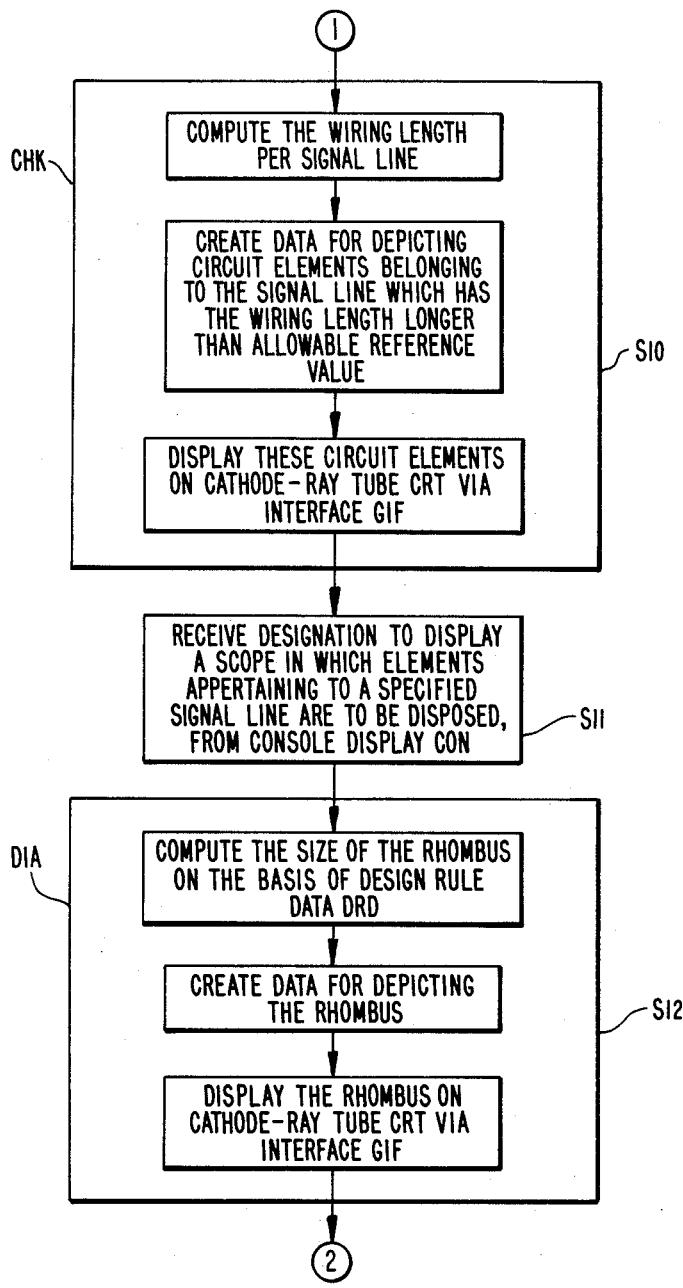

In FIG. 7A, immediately when the console display CON designates the display of a placement situation (S1), the data input module DIN of the layout design graphic system LDGS reads design rule data DRD and design data DD (S2). If there is no placement data, the automatic placement and routing module APR creates the placement data (S3). Thereafter, the placement display module DPL depicts the placement situation so as to project it via the interface to graphic display module GIF on the cathode-ray tube CRT of the graphic display system GDS (S4). Furthermore, with the aid of the console display CON the operator indicates the display of the logical circuit elements which infringe the placement constraint (S5), at which time the placement constraint check module CHK seeks the wiring length per signal line (S10 in FIG. 7B). If the thus sought value is more than the allowable reference value, it is possible to distinguish it from others by a step wherein the logical circuit elements belonging to this signal line are classified by color or linked by the line segment 8 (FIG. 3). When with the aid of the console display CON the operator designates the display of a scope in which an element, for instance 4E, appertaining to a specified single signal line is disposed (S11), the diamond display module DIA computes the size of the rhombus on the basis of the design rule data and displays this rhombus in such a way that it is superposed on a placement state graph in such a way as to set the element 4E at the center thereof (S12). In this case, it is desirable to set the center of the rhombus so as to encompass as many elements as possible among the elements, 4A, 4B, 4C, 4D wich appertain to the single signal line. Thus, the placement state graph shown in FIG. 3 is obtained.

Figure 7C:
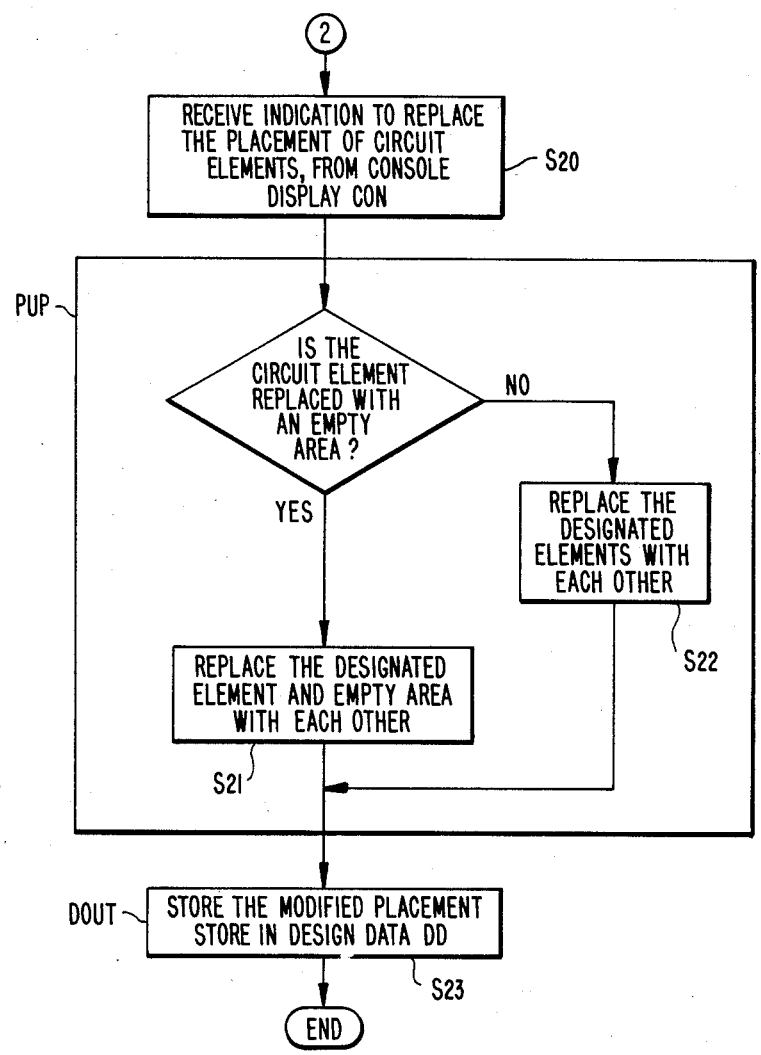

On the basis of this display, the layout designer, by means of the console display CON, indicates that the logical circuit element 4D be replaced with the empty area 5A (S20 in FIG. 7C), at which time the placement update unit PUP modifies the placement state (S21). The thus modified placement state is stored in the design data DD existing in the design data base system DDS by use of the data output module DOUT (S23), whereby the results can be exhibited in the same manner as the previous one and the placement state shown in FIG. 4 can also be obtained.

In relation to the display shown in FIG. 3, when the layout designer makes an attempt to replace the logical circuit element 4D with the element 4F, from the console display CON is indicated a display of placement range corresponding to the element 4F. Thereupon, a rhombus where the element 4F is arranged to become the center thereof is exhibited; and upon the designation, this rhombus is shifted to such a location as to include the element 4D, abiding by the placement constraint of the element 4F, thus obtaining the rhombus 6A shown in FIG. 5. Suppose that the element 4D is moved to the position of 4F, it is practicable to dispose it within the rhombus 6 founded on the placement constraint of 4D. Moreover, if the element 4F is arranged to move to the position of the element 4D, both of the elements 4D, 4F can keep the placement constraint because of the two elements staying in the same rhombus 6A when replacing the element 4D with 4F. The layout designer can therefore designate this replacement with the aid of the console display CON (S22).

As can be determined from the description thus far made, the present embodiment yields favorable effects wherein it is feasible to facilitate the determination as to destinations of the elements and the selection relative to objective elements which are to be modified in placement, inasmuch as the placement constraint can be converted into a visible form like a rhombus.

In the description so far made, there is shown a case where the wiring capacitance is confined for the reason of the placement constraint. However, the situation is the same when the wiring resistance is restricted. Incidentally, it is permissible that a plurality of rhombuses are simultaneously exhibited, if there are plural conditions as in the case of the wiring capacitance and the wiring resistance.

In the above-described points, when converting the placement constraint in a placement scope set by a rhombus, lx and ly which are directly obtained from the reference value are employed as a precondition. It is, however, possible to utilize $\alpha$ lx, $\beta$ ly obtained by lx, ly by coefficients $\alpha$ and $\beta$. With this arithmetic operation, it is feasible to take a wiring detour into consideration or to put in practice in conformity with an actual situation. Especially when seeking a range from a certain point to another point of the equal reference, the following formula may be established: $\alpha = \beta = 2$.

As described above, there is manifested a step wherein placement data is created by automatic placement wiring processing. However, it is likewise applicable that the placement data is created by a manual design.

What is claimed is:

1. A method of updating a layout of circuit elements, comprising the steps of: displaying a graph showing a placement state of respective circuit elements on the basis of placement data determined with a view to satisfying design rule data which includes a placement constraint for a plurality of circuit elements; detecting data representing a group of circuit elements which infringe said placement constraint prescribed by said design rule data within the layout on the basis of said placement data; detecting data corresponding to a region to which said group of circuit elements will have to appertain for the purpose of meeting said placement constraint; displaying said region in such a manner that said region is so disposed as to encompass a part of the circuit elements in said group of circuit elements and to be superposed on said graph; and modifying said placement data on the basis of an element layout modifying indication given from an operator who observes said graph displayed and said region displayed in superposition on said graph, and moves the placement of at least one circuit element of the circuit elements in said group of circuit elements into said region.

2. A method of updating a layout of circuit elements as set forth in claim 1, wherein the central position of said displayed region is moved to a position prescribed by the operator, thereby displaying said region.

3. A method of updating a layout of circuit elements as set forth in claim 1, wherein said circuit elements are disposed on an integrated circuit.

4. A method of updating a layout of circuit elements as set forth in claim 1, wherein said region is displayed as a rhombus.

5. A method of updating a layout of circuit elements as set forth in claim 4, wherein said circuit elements are disposed on an integrated circuit.

6. A method of updating a layout of circuit elements as set forth in claim 4, wherein the central position of said displayed region is moved to a position prescribed by the operator, thereby displaying said region.

7. A method of updating a layout of circuit elements as set forth in claim 4, wherein said lateral and perpendicular diagonal lengths of said rhombus are established according to an allowable value of electrostatic capacitance incident to the wiring between said respective elements, said allowable value being previously set as said placement constraint.

8. A method of updating a layout of circuit elements as set forth in claim 7, wherein said circuit elements are disposed on an integrated circuit.

9. A method of updating a layout of circuit elements as set forth in claim 4, wherein lateral and perpendicular diagonal lengths of said rhombus are determined according to allowable wiring lengths linking said respective elements, said allowable wiring lengths being preliminarily given as said placement constraint.

10. A method of updating a layout of circuit elements as set forth in claim 9, wherein said circuit elements are disposed on an integrated circuit.

11. A method of updating a layout of circuit elements as set forth in claim 9, wherein said lateral and perpendicular diagonal lengths of said rhombus are determined in such a way that they are independent from each other.

12. A method of updating a layout of circuit elements as set forth in claim 11, wherein said circuit elements are disposed on an integrated circuit.

* * * * *